(12) United States Patent
Lee et al.

(10) Patent No.: US 10,269,880 B2
(45) Date of Patent: *Apr. 23, 2019

(54) MANUFACTURING METHOD OF ORGANIC LIGHT EMITTING DISPLAY DEVICE HAVING A PARTITION

(71) Applicant: LG Display Co., Ltd., Seoul (KR)

(72) Inventors: JaeSung Lee, Seoul (KR); Jonghyeok Im, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/926,831

(22) Filed: Mar. 20, 2018

(65) Prior Publication Data

US 2018/0212005 A1     Jul. 26, 2018

Related U.S. Application Data

(63) Continuation of application No. 15/332,219, filed on Oct. 24, 2016, now Pat. No. 9,960,219.

(30) Foreign Application Priority Data

Oct. 30, 2015   (KR) .................. 10-2015-0152617

(51) Int. Cl.
*H01L 27/32* (2006.01)
*H01L 51/52* (2006.01)
(Continued)

(52) U.S. Cl.
CPC ...... *H01L 27/3246* (2013.01); *H01L 51/5212* (2013.01); *H01L 51/5221* (2013.01); *H01L 51/5228* (2013.01); *H01L 2251/5315* (2013.01)

(58) Field of Classification Search
CPC ............ H01L 27/3246; H01L 51/5228; H01L 51/5212; H01L 51/5221; H01L 2251/5315
(Continued)

(56) References Cited

U.S. PATENT DOCUMENTS

2007/0164278 A1    7/2007  Lee et al.
2008/0224963 A1*   9/2008  Takagi ................ H01L 27/3246
                                                     345/76
(Continued)

FOREIGN PATENT DOCUMENTS

KR    20150075188 A    7/2015

OTHER PUBLICATIONS

Chinese Office Action dated Jan. 29, 2018, issued in corresponding Chinese Application No. 201610972003.0.

*Primary Examiner* — Nduka E Ojeh
(74) *Attorney, Agent, or Firm* — Morgan, Lewis & Bockius LLP (57) ABSTRACT

An organic light emitting display device includes a substrate; an anode electrode on the substrate; an auxiliary electrode on the substrate in a same layer as the anode electrode; a partition supporter on the auxiliary electrode; a partition on the partition supporter; an organic emitting layer on the anode electrode and on the partition such that portions separated on the partition are separated from other portions; and a cathode electrode connected with the organic emitting layer and the auxiliary electrode. A lower surface of the partition supporter includes a pair of short sides; and a pair of long sides connecting the pair of short sides and including at least one inclined surface.

16 Claims, 5 Drawing Sheets

(51) Int. Cl.
    *H01L 29/08*     (2006.01)
    *H01L 35/24*     (2006.01)
    *H01L 51/00*     (2006.01)

(58) Field of Classification Search
    USPC ............................ 257/40, E33.062; 438/22
    See application file for complete search history.

(56) References Cited

U.S. PATENT DOCUMENTS

| | | | |
|---|---|---|---|
| 2012/0223342 A1* | 9/2012 | Tanada | H01L 27/3204 257/88 |
| 2013/0099218 A1* | 4/2013 | Lee | H01L 51/5203 257/40 |
| 2013/0320837 A1 | 12/2013 | Weaver et al. | |
| 2015/0179718 A1* | 6/2015 | Kim | H01L 27/3246 257/40 |
| 2016/0351636 A1* | 12/2016 | Lee | H01L 51/5212 |

\* cited by examiner

MANUFACTURING METHOD OF ORGANIC LIGHT EMITTING DISPLAY DEVICE HAVING A PARTITION

This is a continuation of U.S. application Ser. No. 15/332,219, filed Oct. 24, 2016, and also claims priority from Korean Patent Application No. 10-2015-0152617, filed on Oct. 30, 2015, both of which are hereby incorporated by reference as if fully set forth herein.

BACKGROUND

Field of the Disclosure

The present invention relates to an organic light emitting display device, and more particularly, to a top emission type organic light emitting display device.

Discussion of the Related Art

An organic light emitting display (OLED) device, which is a self light emitting display device, has advantages of low power consumption, rapid response speed, high emission efficiency, high luminance, and wide viewing angle. According to a direction of light emitted from an organic light emitting device, the OLED device may generally be classified into a top emission type and a bottom emission type. In a bottom emission type, a circuit device is disposed between a light emitting layer and an image displaying surface, thereby reducing an aperture ratio due to the circuit device. Meanwhile, in a top emission type, a circuit device is not disposed between a light emitting layer and an image displaying surface, thereby improving an aperture ratio.

Figure 1:
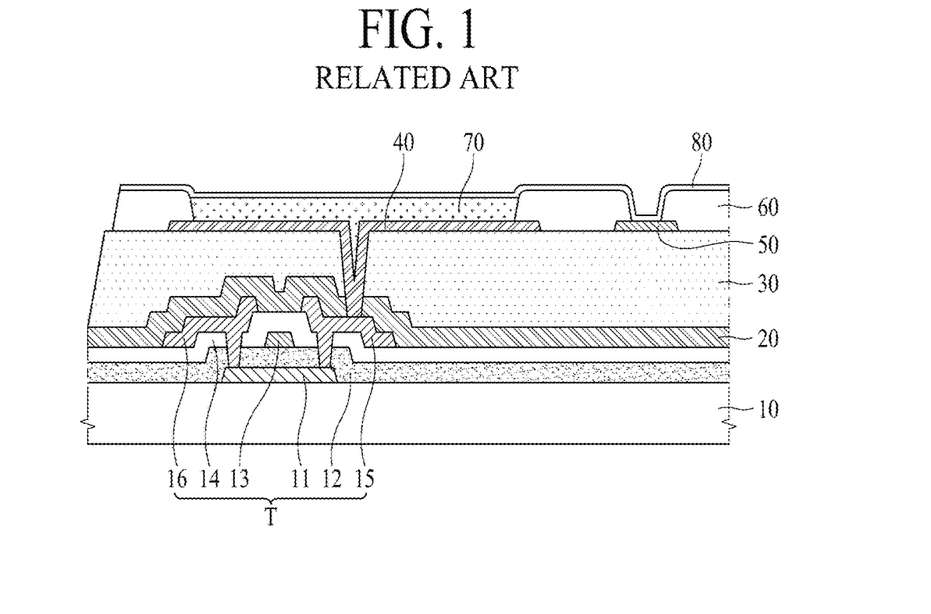
FIG. 1 is a cross sectional view illustrating a related art top emission type OLED device.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15, and a drain electrode 16 is provided on a substrate 10. Then, a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to lower a resistance of a cathode electrode 80, as will be explained later. On the anode electrode 40 and the auxiliary electrode 50, a bank 60 is provided to define a pixel region. Also, an organic emitting layer 70 is provided in the pixel region defined by the bank 60, and the cathode electrode 80 is provided on the organic emitting layer 70.

In the top emission type, light emitted from the organic emitting layer 70 passes through the cathode electrode 80. For this reason, the cathode electrode 80 is formed of a transparent conductive material, which causes an increase of resistance therein. To lower the resistance of the cathode electrode 80, the cathode electrode 80 is connected with the auxiliary electrode 50.

In the top emission type OLED device according to the related art, there is a difficulty in depositing the organic emitting layer 70. If the organic emitting layer 70 is deposited only on the anode electrode 40 in the OLED device according to the related art, an additional process is needed. But, if the organic emitting layer 70 is deposited on an entire surface of the OLED device, it is impossible to connect the auxiliary electrode 50 and the cathode electrode 80 with each other.

SUMMARY

Accordingly, the present invention is directed to an organic light emitting display device that substantially obviates one or more problems due to limitations and disadvantages of the related art.

An object of the present invention is to provide a top emission type organic light emitting display device in which an organic emitting layer is deposited on an entire surface, and an auxiliary electrode and a cathode electrode are connected with each other.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting display device comprises a substrate; an anode electrode on the substrate; an auxiliary electrode on the substrate in a same layer as the anode electrode; a partition supporter on the auxiliary electrode; a partition on the partition supporter; an organic emitting layer on the anode electrode and on the partition such that portions separated on the partition are separated from other portions; and a cathode electrode connected with the organic emitting layer and the auxiliary electrode, wherein a lower surface of the partition supporter includes: a pair of short sides; and a pair of long sides connecting the pair of short sides and including at least one inclined surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, an OLED device according to example embodiments of the present invention will be described in detail with reference to the accompanying drawings. Wherever possible, the same reference numbers will be used throughout the drawings to refer to the same or like parts. Also, in the following description of example embodiments of the present invention, if detailed description of elements or functions known in respect of the present invention is determined to make the subject matter of the present invention unnecessarily obscure, the detailed description will be omitted.

Figure 2:
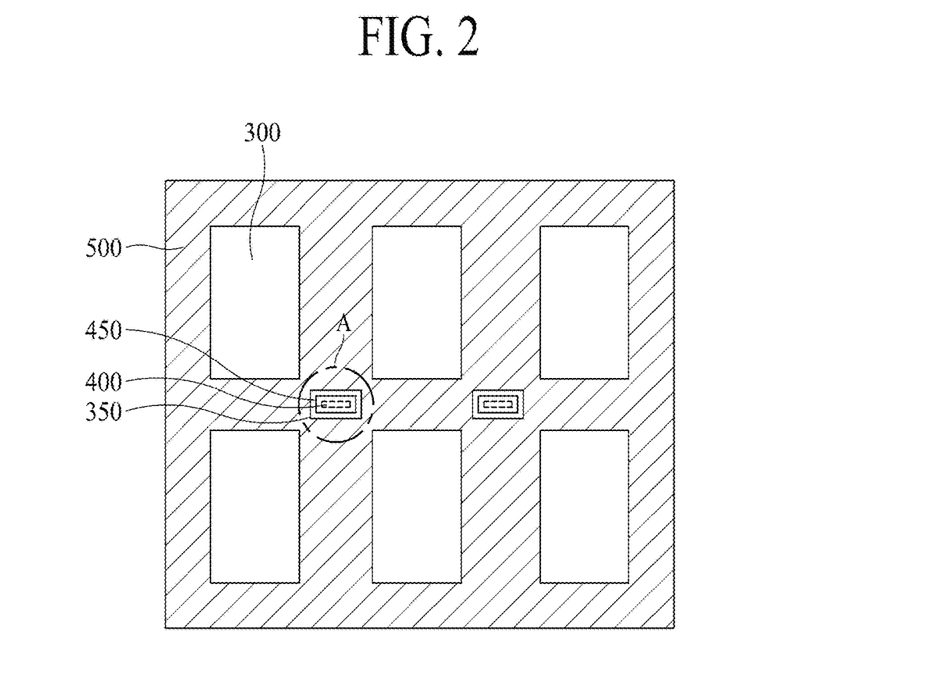
FIG. 2 is a plane view illustrating an OLED device according to a first example embodiment of the present invention.
Figure 3:
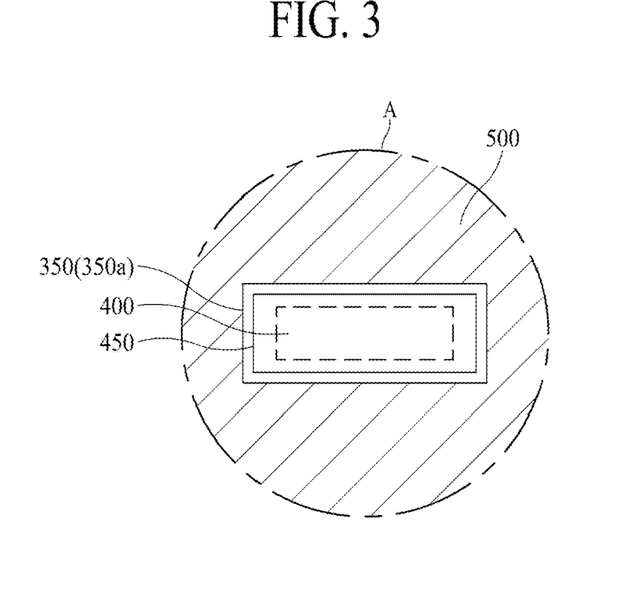
FIG. 3 is an expanded view illustrating an area "A" of FIG. 2.

FIG. 2 is a plane view illustrating an OLED device according to a first example embodiment of the present invention. FIG. 3 is an expanded view illustrating an area "A" of FIG. 2.

As illustrated in FIGS. 2 and 3, the OLED device may include an anode electrode 300, an auxiliary electrode 350, a partition supporter 400, a partition 450, and a bank 500. The anode electrode 300 is separately disposed in every pixel. The anode electrode 300 may be formed of indium-tin-oxide (ITO) or indium-zinc-oxide (IZO). Also, the anode electrode 300 may be formed in a multi-layered structure of at least two layers including molybdenum (Mo), alloy (MoTi) of molybdenum and titanium, aluminum (Al), silver (Ag), APC (Ag;Pb;Cu), etc.

The auxiliary electrode 350 may be provided in a rectangular shape between each pixel, but not limited to this structure. The auxiliary electrode 350 may include an overlapping area, which is partially overlapped with the bank 500, and an auxiliary electrode open area 350a, which is not overlapped with the bank 500, but exposed to the external. The auxiliary electrode open area 350a exposes the auxiliary electrode 350 between a lateral surface of the partition 450 and a lateral surface of the bank 500. The auxiliary electrode 350 is electrically connected with a cathode electrode to be explained later via the auxiliary electrode open area 350a.

The partition supporter 400 having a constant width is disposed on the auxiliary electrode 350, and the partition supporter 400 supports the partition 450. In this case, the partition supporter 400 may be formed of the same material as that of the bank 500, and the partition supporter 400 and the bank 500 may be manufactured by the same process. The partition supporter 400 disposed below the partition 450 supports the partition 450, thereby providing a gap space between the partition 450 and the auxiliary electrode 350. Because the auxiliary electrode 350 is exposed via the gap space, the auxiliary electrode 350 can be electrically connected with the cathode electrode.

The partition 450 is disposed on the partition supporter 400. To provide the partition 450 whose upper surface serves as eaves, a width in the upper surface of the partition 450 is larger than a width in a lower surface of the partition 450. During a process of depositing an organic emitting layer, the upper surface of the partition 450 serves as the eaves so that the organic emitting layer is not deposited on an area below the eaves. Thus, there is no need for a mask pattern covering the upper surface of the auxiliary electrode 350. If the gap space is covered by the upper surface of the partition 450 serving as the eaves, the organic emitting layer can be prevented from permeating into the gap space, thereby expressing the auxiliary electrode 350 to the outside. Especially, because the organic emitting layer is manufactured by a deposition process using a deposition material with superior straightness, the organic emitting layer is not deposited in the gap space for the process of depositing the organic emitting layer.

The bank 500 is provided between the anode electrode 300 and the auxiliary electrode 350. Thus, the anode electrode 300 and the auxiliary electrode 350 are electrically insulated from each other by the bank 500. The bank 500 may be formed of an organic insulating material, for example, polyimide resin, acryl resin, benzocyclobutene (BCB), etc., but is not limited to these materials.

In the OLED device according to the first example embodiment of the present invention, the partition 450 is disposed on the auxiliary electrode 350 such that the auxiliary electrode 350 is exposed to and connected with the cathode electrode without using a mask pattern. However, in the OLED device according to the first example embodiment of the present invention, the width of the partition supporter 400 is constant, whereby the partition 450 may be in contact with the auxiliary electrode 350 without the gap space in-between by a process margin. Accordingly, the OLED device according to the first example embodiment of the present invention may have an electrical connection failure between the auxiliary electrode 350 and the cathode electrode.

Figure 4:
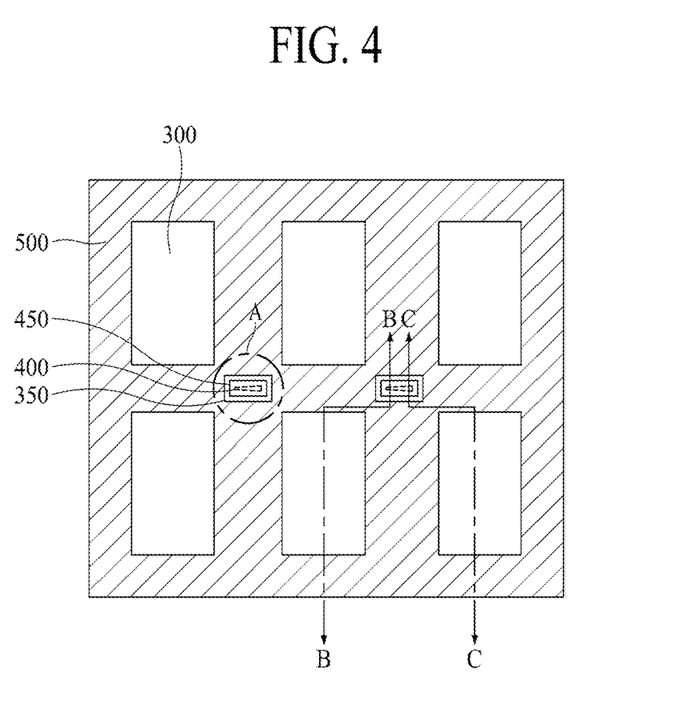
FIG. 4 is a plane view illustrating an OLED device according to a second example embodiment of the present invention.
Figure 5:
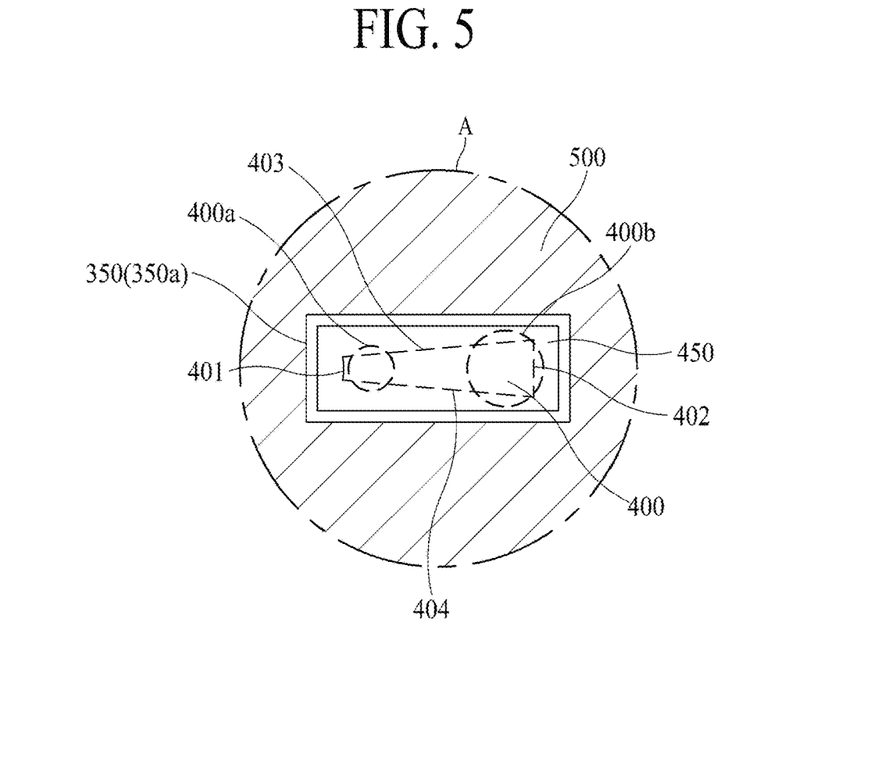
FIG. 5 is an expanded view illustrating an area "A" of FIG. 4.

FIG. 4 is a plane view illustrating an OLED device according to a second example embodiment of the present invention, and FIG. 5 is an expanded view illustrating an area "A" of FIG. 4, wherein the OLED device according to the second example embodiment of the present invention is obtained by changing a structure of the partition supporter in the OLED device according to the first example embodiment of the present invention. Hereinafter, only the partition supporter and partition will be described in detail as follows, and a detailed description for the same parts will be omitted.

A partition supporter 400 is disposed on an auxiliary electrode 350. In this case, a lower surface of the partition supporter 400 may be formed in a polygonal shape, for example, a trapezoid shape. The partition supporter 400 may include a first short side 401, a second short side 402, a first long side 403, and a second long side 404.

The first short side 401 and the second short side 402 correspond to a pair of short sides for the polygonal shape of the lower surface of the partition supporter 400. In this case, the first and second short sides 401 and 402 are opposite to each other.

The first long side 403 and the second long side 404 correspond to a pair of long sides for the polygonal shape of the lower surface of the partition supporter 400. In this case, the first and second long sides 403 and 404 connect the first and second short sides 401 and 402 with each other. In this case, the first and second long sides 403 and 404 form at least one inclined surface, and are symmetrical to each other.

The partition supporter 400 is disposed below a partition 450, and the partition supporter 400 supports the partition 450, thereby providing a gap space between a lower surface of the partition 450 and the auxiliary electrode 350. The gap space enables the auxiliary electrode 350 to be exposed and electrically connected with a cathode electrode. The lower surface of the partition supporter 400 may include a first partition supporter area 400a, and a second partition supporter area 400b. With respect to a length direction of the partition supporter 400, the first partition supporter area 400a is provided at one side of the partition supporter 400, and the second partition supporter area 400b is provided at the other side of the partition supporter 400. The first partition supporter area 400a has a first width, and the second partition supporter area 400b has a second width which is larger than the first width. Accordingly, the lower surface of the partition supporter 400 of the OLED device according to the second example embodiment of the present invention has a trapezoid shape whose width is gradually increased in a direction from the first partition supporter area 400a to the second partition supporter area 400b. Also, a lateral surface of the partition supporter 400 may include the first partition supporter area 400a having a first height, and the second partition supporter area 400b having a second height. That is, a height in the lateral surface of the partition supporter 400 is gradually increased from the first partition supporter area 400a to the second partition supporter area 400b. Accordingly, in the partition supporter 400 of the OLED device according to the second example embodiment of the present invention, the width in the lower surface thereof is gradually increased from the first partition supporter area 400a to the second partition supporter area 400b, and the height in the lateral surface thereof is gradually increased from the first partition supporter area 400a to the second partition supporter area 400b.

The partition 450 is disposed on the partition supporter 400. When the partition 450 is provided on the partition supporter 400, the partition 450 and the partition supporter 400 are manufactured by the same exposure amount. In this case, a height of the gap space depends on the width and height of the partition supporter 400. The height of the gap space may be provided with a first height in the first partition supporter area 400a, and a second height in the second partition supporter area 400b. In this case, the height of the gap space between the auxiliary electrode 350 and the partition 450 disposed on the second partition supporter area 400b is larger than the height of the gap space between the auxiliary electrode 350 and the partition 450 disposed on the first partition supporter area 400a. That is, the height of the gap space is gradually increased from the first height to the second height. Because the partition 450 is manufactured on the first partition supporter area 400a and the second partition supporter area 400b at the same time by the same exposure amount, the height of the gap space is relatively large in the partition 450 disposed on the second partition supporter area 400b having the relatively large width and height.

In the OLED device according to the second example embodiment of the present invention, the width and height of the partition supporter 400 is not constant so that the width and height between the partition 450 and the auxiliary electrode 350 is also not constant. That is, even though there may be an error by a process margin, at least one portion of the partition 450 is separated from the auxiliary electrode 350. Accordingly, in the OLED device according to the second embodiment of the present invention, there may be at least one gap between the partition 450 and the auxiliary electrode 350 so that the auxiliary electrode 350 may be electrically connected with the cathode electrode. That is, an electrical connection failure between the auxiliary electrode 350 and the cathode electrode can be prevented. Also, the partition 450 is disposed on the auxiliary electrode 350 of the OLED device according to the second example embodiment of the present invention so that the auxiliary electrode 350 is exposed to and connected with the cathode electrode without an additional mask pattern.

Figure 6:
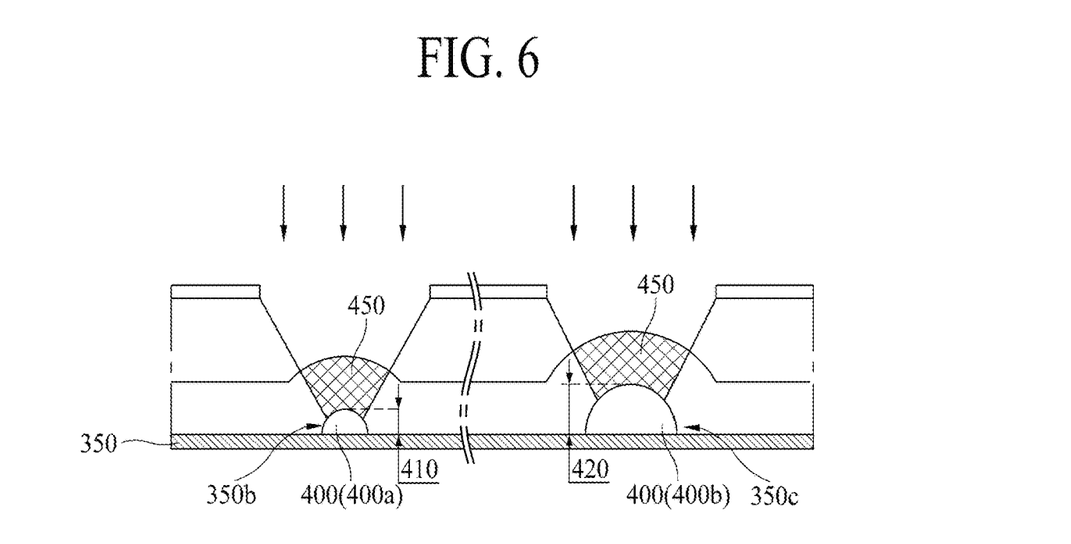
FIG. 6 illustrates a process of the OLED device according to the second example embodiment of the present invention.

FIG. 6 illustrates a process of the OLED device according to the second embodiment of the present invention, which shows the process of manufacturing the partition having a shape that is changed in accordance with the width and height of the partition supporter in the OLED apparatus according to the second embodiment of the present invention.

To compare a process of forming the partition 450 in the first partition supporter area 400a with a process of forming the partition 450 in the second partition supporter area 400b, FIG. 6 shows the partition supporter 400 corresponding to the first partition supporter area 400a on the auxiliary electrode 350, and the partition supporter 400 corresponding to the second partition supporter area 400b on the auxiliary electrode 350. After forming the partition supporter 400 on the auxiliary electrode 350, a partition material is deposited on the partition supporter 400 to form the partition 450. The partition material may be negative type photoresist (negative PR). The negative type photoresist is a photosensitive material, wherein a portion of the negative type photoresist is exposed to light, cured, and patterned. However, another portion of the negative type photoresist is not exposed to light, and is washed by a solvent. The partition material may be curved in accordance with a size of the partition supporter 400. Then, a photomask is disposed on the partition material for forming the partition 450. Thereafter, the partition 450 is manufactured by a negative photoresist process. For the negative photoresist process, the portion of the negative type photoresist that is exposed to light remains by a chemical bond, and the other portion of the negative type photoresist that is not exposed to light is washed out by a developing solution. Accordingly, the partition material covered by the photomask is removed, and the partition material exposed to light is patterned to form the partition 450. In the partition 450 formed on the partition supporter 400 by the same exposure amount, the height of the gap space depends on the width and height of the partition supporter 400. That is, the partition 450 on the partition supporter 400 having the second height is higher than the partition 450 on the partition supporter 400 having the first height so that there is a height difference in the gap space 350b and 350c. Also, a height in a starting point of forming the partition 450 depends on a width difference between the partition 450 disposed in the second partition supporter area 400b whose width is relatively large and the partition 450 disposed in the first partition supporter area 400a whose width is relatively small so that there is a height difference in the gap space 350b and 350c. Because the height of the gap space 350b and 350c is not constant, there is at least one separated portion between the auxiliary electrode 350 and the partition 450 even in case of an error by a process margin. That is, in the OLED device according to the second example embodiment of the present invention, there may be at least one gap between the partition 450 and the auxiliary electrode 350, whereby the auxiliary electrode 350 may be electrically connected with the cathode electrode. That is, an electrical connection failure between the auxiliary electrode 350 and the cathode electrode can be prevented.

Figure 7:
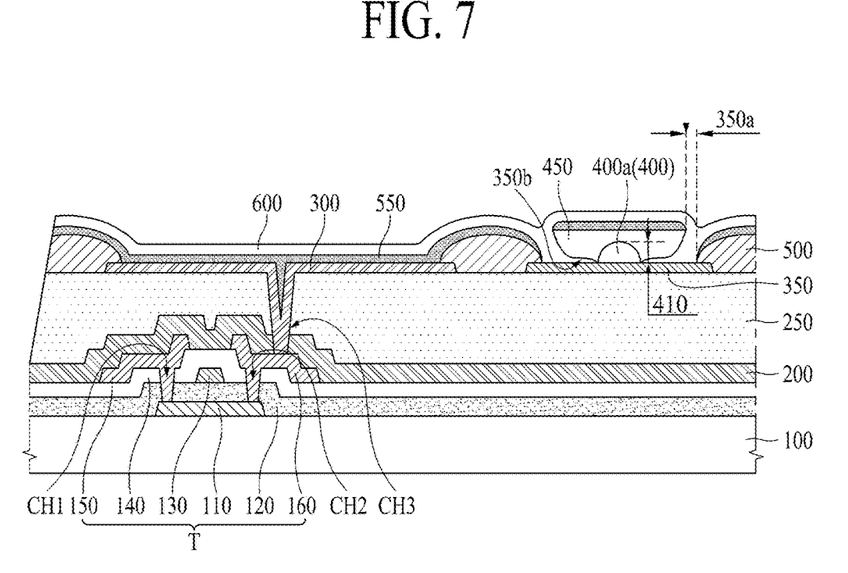
FIG. 7 is a cross sectional view along line B-B of FIG. 4.
Figure 8:
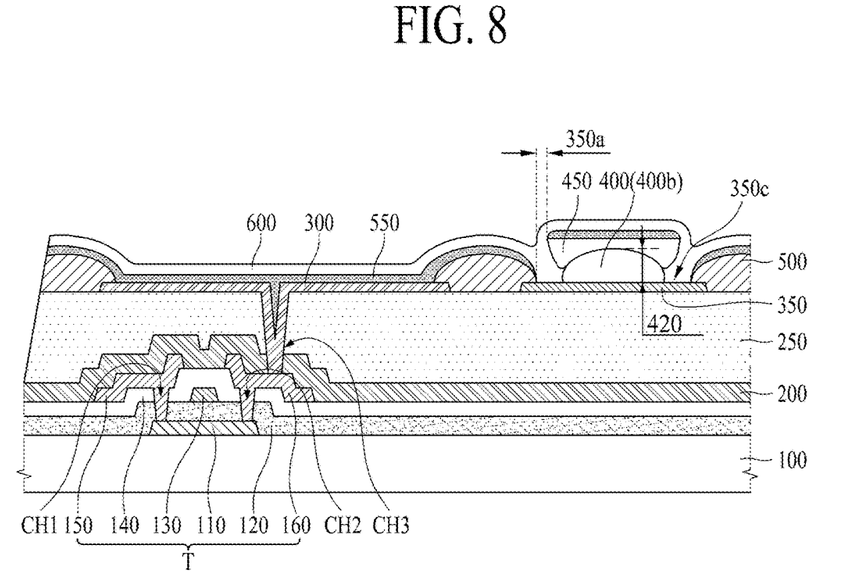
FIG. 8 is a cross sectional view along line C-C of FIG. 4.

FIG. 7 is a cross sectional view along line B-B of FIG. 4, and FIG. 8 is a cross sectional view along line C-C of FIG. 4.

In FIGS. 7 and 8, a thin film transistor (T), a passivation layer 200, a planarization layer 250, an anode electrode 300, the auxiliary electrode 350, the partition supporter 400, the partition 450, a bank 500, an organic emitting layer 550, and the cathode electrode 600 are provided on a substrate 100 of the OLED device according to the second embodiment of the present invention. The thin film transistor (T) may include an active layer 110, a gate insulating film 120, a gate electrode 130, an insulating interlayer 140, a source electrode 150, and a drain electrode 160.

The active layer 110 is disposed on the substrate 100, and is overlapped with the gate electrode 130. The active layer 110 may be formed of a silicon-based semiconductor material or an oxide-based semiconductor material. Although not shown in the drawings, a light-shielding layer may be additionally provided between the substrate 100 and the active layer 110.

The gate insulating film 120 is disposed on the active layer 110. The gate insulating film 120 is provided to insulate the active layer 110 and the gate electrode 130 from each other. In this case, the gate insulating film 120 may be formed in a single-layered structure of the inorganic insulating material, such as silicon oxide (SiOx), silicon nitride (SiNx), or a multi-layered structure of the above silicon oxide (SiOx) and silicon nitride (SiNx), but not limited to these materials and structures.

The gate electrode 130 is provided on the gate insulating film 120. The gate electrode 130 overlaps the active layer 110, and the gate insulating film 120 is interposed between the gate electrode 130 and the active layer 110 overlapping each other. The gate electrode 130 may be formed in a single-layered structure or multi-layered structure among molybdenum (Mo), aluminum (Al), chrome (Cr), gold (Au), titanium (Ti), nickel (Ni), neodymium (Nd), copper (Cu) and their alloys, but is not limited to these materials.

The insulating interlayer 140 is provided on the gate electrode 130. The insulating interlayer 140 may be formed of the same material as that of the gate insulating film 120. For example, the insulating interlayer 140 may be formed in a single-layered structure of the inorganic insulating material, such as silicon oxide (SiOx), silicon nitride (SiNx), or a multi-layered structure of the above silicon oxide (SiOx) and silicon nitride (SiNx), but is not limited to these materials and structures.

The source electrode 150 and the drain electrode 160 confronting each other are provided on the insulating interlayer 140. A first contact hole (CH1) for exposing one end of the active layer 110 is provided in the aforementioned gate insulating film 120 and the insulating interlayer 140, and a second contact hole (CH2) for exposing the other end of the active layer 110 is provided in the aforementioned gate insulating film 120 and the insulating interlayer 140. The source electrode 150 is connected with the other end of the active layer 110 via the first contact hole (CH1), and the drain electrode 160 is connected with one end of the active layer 110 via the second contact hole (CH2).

A structure of the thin film transistor layer (T) is not limited to the above structure. That is, a structure of the thin film transistor layer (T) may be changed to various shapes generally known to those in the art. For example, the drawings show a top gate structure where the gate electrode 130 is provided on the active layer 110, but other structures may be provided. That is, a bottom gate structure may be provided where the gate electrode 130 is below the active layer 110.

The passivation layer 200 is provided on the thin film transistor layer (T). The passivation layer 200 protects the thin film transistor layer (T). The passivation layer 200 may be formed of an inorganic insulating material, for example, silicon oxide film (SiOx) or silicon nitride film (SiNx), but is not limited to these materials.

The planarization layer 250 is provided on the passivation layer 200. The planarization layer 250 is provided to planarize an upper surface of the substrate 100 with the thin film transistor layer (T). The planarization layer 250 may be formed of an organic insulating material, for example, acryl resin, epoxy resin, phenolic resin, polyamide resin, polyimide resin, etc., but is not limited to these materials.

The anode electrode 300 is disposed on the planarization layer 250. A third contact hole (CH3) for exposing the drain electrode 160 is prepared in the aforementioned passivation layer 200 and the planarization layer 250, and the anode electrode 300 is connected with the drain electrode 160 via the third contact hole (CH3). The auxiliary electrode 350 is disposed on the planarization layer 250. That is, the auxiliary electrode 350 and the anode electrode 300 are provided in the same layer. To reduce a resistance of the cathode electrode 600, as will to be explained later, the auxiliary electrode 350 is connected with the cathode electrode 600.

The partition supporter 400, which supports the partition 450, is disposed on the auxiliary electrode 350. The partition supporter 400 and the bank 500 may be manufactured by the same process. In this case, the partition supporter 400, which is disposed below the partition 450, supports the partition 450 to prepare the gap space 350b and 350c between the partition 450 and the auxiliary electrode 350. The auxiliary electrode 350 is exposed via the gap space 350b and 350c, and is electrically connected with the cathode electrode 600. The lower surface of the partition supporter 400 includes the first partition supporter area 400a, and the second partition supporter area 400b. With respect to the length direction of the partition supporter 400, the first partition supporter area 400a is provided at one side of the partition supporter 400, and the second partition supporter area 400b is provided at the other side of the partition supporter 400. The first partition supporter area 400a has the first width, and the second partition supporter area 400b has the second width, which is larger than the first with. Also, the lateral surface of the partition supporter 400 may include the first partition supporter area 400a having the first height, and the second partition supporter area 400b having the second height. That is, the height in the lateral surface of the partition supporter 400 is gradually increased from the first partition supporter area 400a to the second partition supporter area 400b. Accordingly, in the partition supporter 400 of the OLED device according to the second example embodiment of the present invention, the width in the lower surface thereof is gradually increased from the first partition supporter area 400a to the second partition supporter area 400b, and the height in the lateral surface thereof is gradually increased from the first partition supporter area 400a to the second partition supporter area 400b.

The partition 450 is disposed on the partition supporter 400. When the partition 450 is provided on the partition supporter 400, the partition 450 and the partition supporter 400 are manufactured by the same exposure amount. In this case, the height of the gap space depends on the width in the lower surface of the partition supporter 400 and the height in the lateral surface of the partition supporter 400. As shown in FIG. 7, if the partition 450 is disposed on the first partition supporter area 400a, the first gap space 350b is prepared between the partition 450 and the auxiliary electrode 350. As shown in FIG. 8, if the partition 450 is disposed on the second partition supporter area 400b, the gap space 350c is prepared between the partition 450 and the auxiliary electrode 350. Because the width and height of the partition supporter 400 in the second partition supporter area 400b is larger than the width and height of the partition supporter 400 in the first partition supporter area 400a, the height of the second gap space 350c is larger than the height of the first gap space 350b. That is, because the partition 450 is manufactured on the first partition supporter area 400a and the second partition supporter area 400b at the same time by the same exposure amount, the height of the second gap space 350c is relatively large in the partition 450 disposed on the second partition supporter area 400b having the relatively large width and height. In the OLED device according to the second example embodiment of the present invention, the shape of the partition supporter 400 is not constant so that the width between the partition 450 and the auxiliary electrode 350 is also not constant. That is, even if there is an error by a process margin, at least one portion of the partition 450 is separated from the auxiliary electrode 350. Accordingly, in the OLED device according to the second example embodiment of the present invention, there may be at least one gap between the partition 450 and the auxiliary electrode 350, whereby the auxiliary electrode 350 may be electrically connected with the cathode electrode 600. That is, an electrical connection failure between the auxiliary electrode 350 and the cathode electrode 600 can be prevented.

The bank 500 is provided on the anode electrode 300 and the auxiliary electrode 350. The bank 500 partially overlaps the anode electrode 300 and the auxiliary electrode 350. That is, the bank 500, which exposes the upper surface of the anode electrode 300 and auxiliary electrode 350, is provided on one side and the other side of the anode electrode 300 and auxiliary electrode 350 to cover the lateral surface of the anode electrode 300 and auxiliary electrode 350. Because the bank 500 is provided to expose the upper surface of the anode electrode 300, an image-displaying area can be secured. Also, the bank 500 is provided to have the auxiliary electrode open area 350a for exposing the upper surface of the auxiliary electrode 350 so that an electrical connection space between the auxiliary electrode 350 and the cathode electrode 600 can be secured. The bank 500 is disposed between the anode electrode 300 and the auxiliary electrode 350, and the bank 500 electrically insulates the anode electrode 300 and the auxiliary electrode 350 from each other. The bank 500 may be formed of an organic insulating material, for example, polyimide resin, acryl resin, benzocyclobutene BCB, etc., but is not limited to these materials.

The organic emitting layer 550 is disposed on the anode electrode 300. The organic emitting layer 550 may include a hole injecting layer, a hole transporting layer, an emitting layer, an electron transporting layer, and an electron injecting layer. A structure of the organic emitting layer 550 may be changed to various shapes generally known to those in the art. The organic emitting layer 550 may extend to the upper surface of the bank 500. However, when the organic emitting layer 550 extends to the upper surface of the bank 500, the organic emitting layer 550 is not formed in the gap space 350b and 350c prepared between the partition 450 and the auxiliary electrode 350. As described above, the organic emitting layer 550 may be formed by the deposition process without the mask for covering the upper surface of the auxiliary electrode 350, and the organic emitting layer 550 may be provided on the upper surface of the partition 450.

The cathode electrode 600 is provided on the organic emitting layer 550. As the cathode electrode 600 is provided on a surface from which light is emitted, the cathode electrode 600 is formed of a transparent conductive material. Thus, a resistance of the cathode electrode 600 is increased because the cathode electrode 600 is formed of the transparent conductive material. To lower the resistance of the cathode electrode 600, the cathode electrode 600 is connected with the auxiliary electrode 350. The cathode electrode 600 is connected with the auxiliary electrode 350 via the auxiliary electrode open area 350a and the gap space 350b and 350c. The cathode electrode 600 may be manufactured by sputtering. That is, a deposition process using a deposition material with inferior straightness. Accordingly, the cathode electrode 600 may be deposited in the gap space 350b and 350c for the deposition process of the cathode electrode 600.

Although not shown, an encapsulation layer for preventing a permeation of moisture may be additionally provided on the cathode electrode 600. The encapsulation layer may be formed of various materials generally known to those in the art. Although not shown, a color filter for each pixel may be additionally provided on the cathode electrode 600. In this case, white light may be emitted from the organic emitting layer 550.

In the OLED device according to the second example embodiment of the present invention, there may be at least one gap between the partition 450 and the auxiliary electrode 350, whereby the auxiliary electrode 350 may be electrically connected with the cathode electrode 600. That is, an electrical connection failure between the auxiliary electrode 350 and the cathode electrode 600 can be prevented. Also, the partition 450 is disposed on the auxiliary electrode 350 of the OLED device according to the second example embodiment of the present invention, whereby the auxiliary electrode 350 is exposed to and connected with the cathode electrode 600 without an additional mask pattern.

Figure 9:
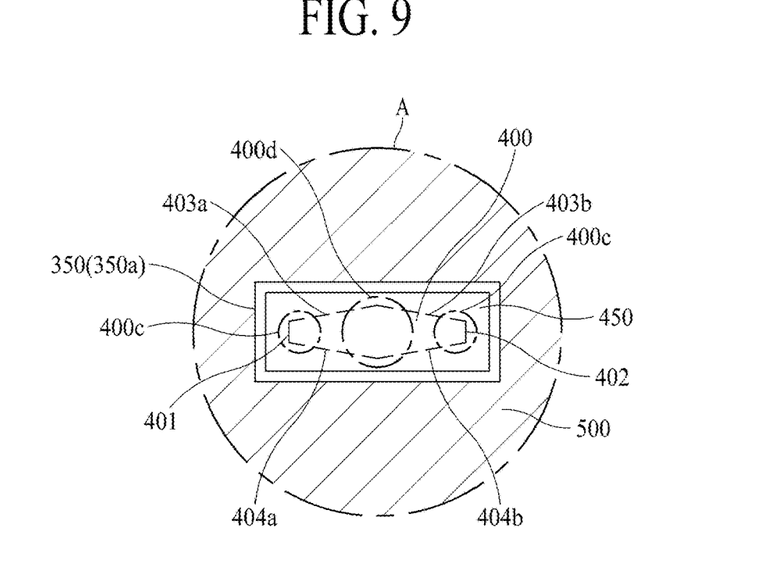
FIG. 9 is an expanded plane view illustrating an auxiliary electrode of an OLED device according to a third example embodiment of the present invention.

FIG. 9 is an expanded plane view illustrating an auxiliary electrode of an OLED device according to the third example embodiment of the present invention, which is obtained by changing a structure of the partition supporter in the OLED device according to the first example embodiment of the present invention shown in FIGS. 2 and 3. Hereinafter, only the partition supporter and partition will be described in detail as follows, and a detailed description for the same parts will be omitted.

A partition supporter 400 is disposed on an auxiliary electrode 350, and the partition supporter 400 supports a partition 450. In this case, a lower surface of the partition supporter 400 may be formed in a polygonal shape, for example, a shape with two trapezoids being symmetric with respect to their long bottom surfaces. The partition supporter 400 may include a first short side 401, a second short side 402, a first long side 403a having a first inclined surface, a second long side 403b having a second inclined surface, a second long side 404a having a first inclined surface, and a second long side 404b having a second inclined surface.

The first short side 401 and the second short side 402 correspond to a pair of short sides for the polygonal shape of the lower surface of the partition supporter 400. In this case, the first and second short sides 401 and 402 are opposite to each other.

The first and second long side 403a and 404a having the first inclined surface and the first and second long sides 403b and 404b having the second inclined surface correspond to a pair of long sides for the polygonal shape of the lower surface of the partition supporter 400. In this case, the first and second long sides 403a and 404a having the first inclined surface and the first and second long sides 403b and 404b having the second inclined surface connect the first and second short sides 401 and 402 with each other. In this case, the first and second long sides 403a and 404b having the first inclined line and the first and second long sides 403b and 404b having the second inclined surface may be symmetrical with respect to a central line between the first and second short sides 401 and 402.

The partition supporter 400 disposed below the partition 450 supports the partition 450, thereby providing a gap space between the lower surface of the partition 450 and the auxiliary electrode 350. The gap space enables the auxiliary electrode 350 to be exposed and electrically connected with a cathode electrode to be explained later. The lower surface of the partition supporter 400 may include a first partition supporter area 400c, and a second partition supporter area 400d. With respect to a length direction of the partition supporter 400, the first partition supporter area 400c is provided at one side of the partition supporter 400 and the other side of the partition supporter 400, and the second partition supporter area 400d is provided at a central region between one side of the partition supporter 400 and the other side of the partition supporter 400. The first partition supporter area 400c has a first width, and the second partition supporter area 400d has a second width which is larger than the first width. Accordingly, the lower surface of the partition supporter 400 of the OLED device according to the third example embodiment of the present invention has a shape whose width is gradually increased in a direction from the first partition supporter area 400c to the second partition supporter area 400d. Also, a lateral surface of the partition supporter 400 may include the first partition supporter area 400c having a first height, and the second partition supporter area 400d having a second height. That is, a height in the lateral surface of the partition supporter 400 is gradually increased from the first partition supporter area 400c to the second partition supporter area 400d. Accordingly, in the partition supporter 400 of the OLED device according to the third example embodiment of the present invention, the width in the lower surface thereof is gradually increased from the first partition supporter area 400c to the second partition supporter area 400d, and the height in the lateral surface thereof is gradually increased from the first partition supporter area 400c to the second partition supporter area 400d.

The partition 450 is disposed on the partition supporter 400. When the partition 450 is provided on the partition supporter 400, the partition 450 and the partition supporter 400 are manufactured by the same exposure amount. In this case, a height of the gap space depends on the width and height of the partition supporter 400. The height of the gap space may be provided with a first height in the first partition supporter area 400c, and a second height in the second partition supporter area 400d. In this case, the height of the gap space between the auxiliary electrode 350 and the partition 450 disposed on the second partition supporter area 400d is larger than the height of the gap space between the auxiliary electrode 350 and the partition 450 disposed on the first partition supporter area 400c. That is, the height of the gap space is gradually increased from the first height to the second height. According as the partition 450 is manufactured on the first partition supporter area 400c and the second partition supporter area 400d at the same time by the same exposure amount, the height of the gap space is relatively large in the partition 450 disposed on the second partition supporter area 400d having the relatively large width and height.

In the OLED device according to a third example embodiment of the present invention, the width and height of the partition supporter 400 is not constant so that the width and height between the partition 450 and the auxiliary electrode 350 is also not constant. That is, even though there is an error by a process margin, at least one portion of the partition 450 is separated from the auxiliary electrode 350. Accordingly, in the OLED device according to the third example embodiment of the present invention, there may be at least one gap between the partition 450 and the auxiliary electrode 350, whereby the auxiliary electrode 350 may be electrically connected with the cathode electrode. That is, an electrical connection failure between the auxiliary electrode 350 and the cathode electrode can be prevented. Also, the partition 450 is disposed on the auxiliary electrode 350 of the OLED device according to the third example embodiment of the present invention, whereby the auxiliary electrode 350 is exposed to and connected with the cathode electrode without an additional mask pattern.

Figure 10:
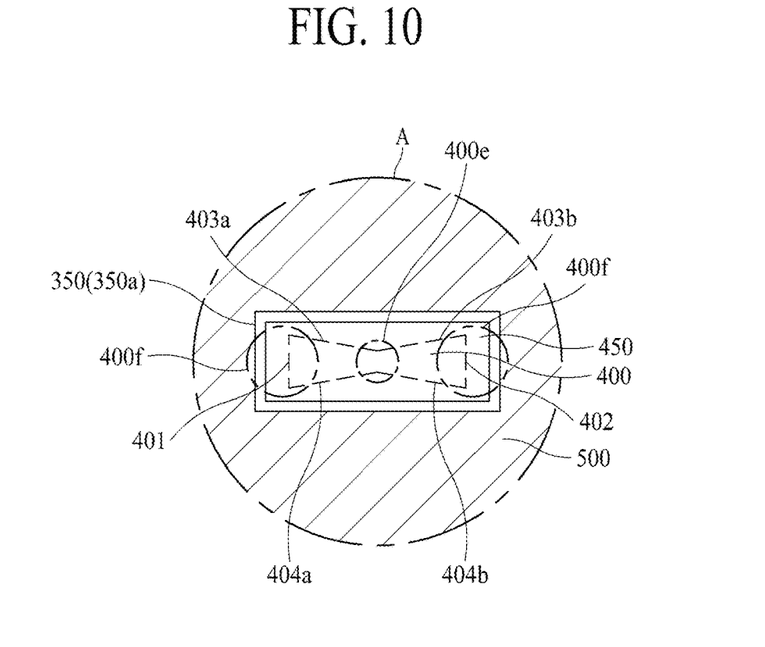
FIG. 10 is an expanded plane view illustrating an auxiliary electrode of an OLED device according to a fourth example embodiment of the present invention.

FIG. 10 is an expanded plane view illustrating an auxiliary electrode of an OLED device according to a fourth example embodiment of the present invention, which is obtained by changing a structure of the partition supporter in the OLED device according to the first embodiment of the present invention shown in FIGS. 2 and 3. Hereinafter, only the partition supporter and partition will be described in detail as follows, and a detailed description for the same parts will be omitted.

A partition supporter 400 is disposed on an auxiliary electrode 350, and the partition supporter 400 supports a partition 450. In this case, a lower surface of the partition supporter 400 may be formed in a polygonal shape, for example, a shape with two trapezoids being symmetric with respect to their short bottom surfaces. The partition supporter 400 may include a first short side 401, a second short side 402, a first long side 403a having a first inclined surface, a first long side 403a having a second inclined surface, a second long side 404a having a first inclined surface, and a second long side 404b having a second inclined surface.

The first short side 401 and the second short side 402 correspond to a pair of short sides for the polygonal shape of the lower surface of the partition supporter 400. In this case, the first and second short sides 401 and 402 are opposite to each other.

The first and second long sides 403a and 404a having the first inclined surface and the first and second long sides 403b and 404b having the second inclined surface correspond to a pair of long sides for the polygonal shape of the lower surface of the partition supporter 400. In this case, the first and second long sides 403a and 404a having the first inclined surface and the first and second long sides 403b and 404b having the second inclined surface connect the first and second short sides 401 and 402 with each other. In this case, the first and second long sides 403a and 404b having the first inclined line and the first and second long sides 403b and 404b having the second inclined surface may be symmetrical with respect to a central line between the first and second short sides 401 and 402.

The partition supporter 400 disposed below the partition 450 supports the partition 450, thereby providing a gap space between the lower surface of the partition 450 and the auxiliary electrode 350. The gap space enables the auxiliary electrode 350 to be exposed and electrically connected with a cathode electrode to be explained later. The lower surface of the partition supporter 400 may include a first partition supporter area 400e, and a second partition supporter area 400f. With respect to a length direction of the partition supporter 400, the second partition supporter area 400f is provided at one side of the partition supporter 400 and the other side of the partition supporter 400, and the first partition supporter area 400e is provided at a central region between one side of the partition supporter 400 and the other side of the partition supporter 400. The first partition supporter area 400e has a first width, and the second partition supporter area 400f has a second width, which is larger than the first width. Accordingly, the lower surface of the partition supporter 400 of the OLED device according to the fourth example embodiment of the present invention has a shape whose width is gradually increased in a direction from the first partition supporter area 400e to the second partition supporter area 400f. Also, a lateral surface of the partition supporter 400 may include the first partition supporter area 400e having a first height, and the second partition supporter area 400f having a second height. That is, a height in the lateral surface of the partition supporter 400 is gradually increased from the first partition supporter area 400e to the second partition supporter area 400f. Accordingly, in case of the partition supporter 400 of the OLED device according to the fourth example embodiment of the present invention, the width in the lower surface thereof is gradually increased from the first partition supporter area 400e to the second partition supporter area 400f, and the height in the lateral surface thereof is gradually increased from the first partition supporter area 400e to the second partition supporter area 400f.

The partition 450 is disposed on the partition supporter 400. When the partition 450 is provided on the partition supporter 400, the partition 450 and the partition supporter 400 are manufactured by the same exposure amount. In this case, a height of the gap space depends on the width and height of the partition supporter 400. The height of the gap space may be provided with a first height in the first partition supporter area 400e, and a second height in the second partition supporter area 400f. In this case, the height of the gap space between the auxiliary electrode 350 and the partition 450 disposed on the second partition supporter area 400f is larger than the height of the gap space between the auxiliary electrode 350 and the partition 450 disposed on the first partition supporter area 400e. That is, the height of the gap space is gradually increased from the first height to the second height. Because the partition 450 is manufactured on the first partition supporter area 400e and the second partition supporter area 400f at the same time by the same exposure amount, the height of the gap space is relatively large in the partition 450 disposed on the second partition supporter area 400f having the relatively large width and height.

In the OLED device according to the fourth example embodiment of the present invention, the width and height of the partition supporter 400 is not constant so that the width and height between the partition 450 and the auxiliary electrode 350 is also not constant. That is, even though there is an error by a process margin, at least one portion of the partition 450 is separated from the auxiliary electrode 350. Accordingly, in the OLED device according to the fourth example embodiment of the present invention, there may be at least one gap between the partition 450 and the auxiliary electrode 350, whereby the auxiliary electrode 350 may be electrically connected with the cathode electrode. That is, an electrical connection failure between the auxiliary electrode 350 and the cathode electrode can be prevented. Also, the partition 450 is disposed on the auxiliary electrode 350 of the OLED device according to the fourth example embodiment of the present invention, whereby the auxiliary electrode 350 is exposed to and connected with the cathode electrode without an additional mask pattern.

According to embodiments of the present invention, the partition 450 is provided on the auxiliary electrode 350 so that the auxiliary electrode 350 is exposed to and connected with the cathode electrode without using the mask pattern. Also, because the partition supporter 400 is changed in shape, the width between the partition 450 and the auxiliary electrode 350 is also changed so that at least one separated portion between the auxiliary electrode 350 and the partition 450 can be provided. Accordingly, there may be at least one gap between the partition 450 and the auxiliary electrode 350, whereby the auxiliary electrode 350 may be electrically connected with the cathode electrode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A method of manufacturing an organic light emitting display device, the method comprising:
   providing a substrate;
   forming an anode electrode on the substrate;
   forming an auxiliary electrode on the substrate in a same layer as the anode electrode;
   forming a partition supporter on the auxiliary electrode;
   forming a partition on the partition supporter;
   forming an organic emitting layer disposed on the anode electrode and on the partition such that portions separated on the partition are separated from other portions;
   forming a cathode electrode connected with the organic emitting layer and the auxiliary electrode,
   forming a bank for exposing the auxiliary electrode;
   forming an auxiliary electrode open area for exposing the auxiliary electrode between a lateral surface of the partition and a lateral surface of the bank; and
   forming a gap space between the lower surface of the partition and the auxiliary electrode,
   wherein the cathode electrode is connected to the auxiliary electrode in the auxiliary electrode open area or the gap space,
   wherein a lateral surface of the partition supporter includes:
   a first partition supporter area having a first height; and
   a second partition supporter area having a second height,
   wherein the gap space has a first height in the first partition supporter area and a second height in the second partition supporter area, and wherein the first height is different from the second height, wherein a lower surface of the partition supporter includes:
a pair of short sides; and
a pair of long sides connecting the pair of short sides and including at least one inclined surface.

2. The method according to claim 1, wherein the lower surface of the partition supporter has a trapezoidal shape.

3. The method according to claim 1, wherein the pair of long sides respectively have first and second inclined surfaces configured to connect the pair of short sides with each other, and wherein the first and second inclined surfaces are symmetrical with respect to a central line between the pair of short sides.

4. The method according to claim 1, wherein the lower surface of the partition supporter includes:
a first partition supporter area having a first width; and
a second partition supporter area having a second width, and
wherein the second width is larger than the first width.

5. The method according to claim 1, wherein the second height is larger than the first height.

6. The method according to claim 1, wherein a height of the gap space gradually increases from the first height to the second height.

7. The method according to claim 1, wherein the first partition supporter area is provided at one side of the partition supporter, and wherein the second partition supporter area is provided at the other side of the partition supporter with respect to a length direction of the partition supporter.

8. The method according to claim 7, wherein a height of the gap space gradually increases from the first height to the second height.

9. The method according to claim 1, wherein the first partition supporter area is provided at one side of the partition supporter and the other side of the partition supporter, and wherein the second partition supporter area is provided at a central region between one side of the partition supporter and the other side of the partition supporter with respect to a length direction of the partition supporter.

10. The method according to claim 9, wherein a height of the gap space gradually increases from the first height to the second height.

11. The method according to claim 1, wherein the second partition supporter area is provided at one side of the partition supporter and the other side of the partition supporter, and wherein the first partition supporter area is provided at a central region between one side of the partition supporter and the other side of the partition supporter with respect to a length direction of the partition supporter.

12. The method according to claim 11, wherein a height of the gap space gradually increases from the first height to the second height.

13. The method according to claim 1, wherein the lower surface of the partition supporter has a rectangular shape.

14. The method according to claim 1, wherein the lower surface of the partition supporter has a trapezoidal shape including a first short side, a second short side having a length greater than the first short side, a first long side, and a second long side having a length substantially equal to the first long side.

15. The method according to claim 1, wherein the lower surface of the partition supporter has a polygonal shape of two symmetric trapezoids being joined along the long bottom surface of each of the symmetric trapezoids.

16. The method according to claim 1, wherein the lower surface of the partition supporter has a polygonal shape of two symmetric trapezoids being joined along the short bottom surface of each of the symmetric trapezoids.

* * * * *